(12) United States Patent
Wu

(10) Patent No.: US 6,211,556 B1
(45) Date of Patent: Apr. 3, 2001

(54) ELIMINATING BURIED CONTACT TRENCH IN MOSFET DEVICES HAVING SELF-ALIGNED SILICIDE

(75) Inventor: Shye-Lin Wu, Hsinchu (TW)

(73) Assignee: Texas Instruments - Acer Incorporated, Hsinchu (TW)

(*) Notice: Subject to any disclaimer, the term of this patent is extended or adjusted under 35 U.S.C. 154(b) by 0 days.

(21) Appl. No.: 09/323,773

(22) Filed: Jun. 1, 1999

Related U.S. Application Data

(63) Continuation-in-part of application No. 09/065,323, filed on Apr. 23, 1998.

(51) Int. Cl.[7] .......................... H01L 29/76; H01L 29/94; H01L 31/062; H01L 31/113; H01L 31/119
(52) U.S. Cl. .................. 257/382; 257/383; 257/384; 257/340; 257/336; 257/344
(58) Field of Search .................... 257/217, 744, 257/382, 758, 588, 383, 384, 336, 344, 408, 340

(56) References Cited

U.S. PATENT DOCUMENTS

| | | | |
|---|---|---|---|
| 5,315,150 | * 5/1994 | Furuhata | 257/588 |
| 5,317,197 | * 5/1994 | Roberts | 257/401 |
| 5,596,215 | * 1/1997 | Huang | 257/344 |
| 5,926,706 | * 7/1999 | Liaw et al. | 438/238 |
| 6,107,642 | * 8/2000 | Sundaresan | 257/268 |

FOREIGN PATENT DOCUMENTS 5-206066 * of 0000 (JP) ...................... 257/368

* cited by examiner

*Primary Examiner*—Eddie C. Lee
*Assistant Examiner*—Jesse A. Fenty

(57) ABSTRACT

A MOSFET device with buried contact structure on a semiconductor substrate has the following major elements with their relative locations. A gate insulator is on a portion of the substrate and a gate electrode is on the gate insulator. A gate sidewall structure is located on sidewalls of the gate electrode. Inside the substrate, a lightly doped source/drain region is under the gate sidewall structure, and a doped source/drain region is abutting the lightly doped source/drain region and located aside from a region under the gate sidewall structure. In addition, a doped buried contact region is also in the substrate next to the doped source/drain region. On the substrate, a silicon connection is located on a portion of the doped buried contact region, and a shielding block is on the doped buried contact region covering only a region uncovered by the silicon connection. Specifically, the shielding block includes dielectric sidewalls and silicon sidewalls and the shielding block is formed right next to the edge of the silicon connection.

20 Claims, 5 Drawing Sheets

ELIMINATING BURIED CONTACT TRENCH IN MOSFET DEVICES HAVING SELF-ALIGNED SILICIDE

CROSS REFERENCE TO RELATED APPLICATIONS

This invention is a continuation-in-part of application Ser. No. 09/065,323 filed under the title of "TRENCH-FREE BURIED CONTACT FOR SRAM DEVICES" filed at Apr. 23, 1998, which is assigned to same assignee with the same inventor as the present application.

FIELD OF THE INVENTION

The present invention relates to semiconductor devices, and more specifically, to MOSFET (metal oxide semiconductor field effect transistor) devices having self-aligned silicide and buried contact connection free of buried contact trench.

BACKGROUND OF THE INVENTION

From the first invention of integrated circuits in 1960, the number of devices on a chip has grown at an explosively increasing rate. The technologies of the semiconductor industry have been researched continuously for almost four decades. The progress of the semiconductor integrated circuits has stepped into the ULSI (ultra large scale integration) level or at an even higher level. The capacity of a single semiconductor chip has increased from several thousand devices to hundreds of million devices, or even billions of devices. The integrated circuits devices like transistors, capacitors, and connections must be greatly narrowed simultaneously to accommodate the continuously raising requirements.

The increasing packing density of the integrated circuits generates numerous challenges to the semiconductor manufacturing process. Every device needs to be formed within a smaller size without damaging the characteristics and the operations. The demands on high packing density and low heat generation devices with good reliability and long operation life must be maintained without any degradation in their functions.

All the challenges and demands in fabrication are expected to be solved with the four key aspects of the semiconductor manufacturing, including the lithography, the film formation, the etching, and the diffusion processing technologies. The continuous increase in the packing density of the integration circuits must be accompanied with a smaller feature size. In addition to chip area and functional considerations, all the devices with smaller size must be achieved with simplified and reliable manufacturing steps to raise the yield and reduce the cost of the products.

In the application of memory devices, the SRAM device plays a vital role as a semiconductor storage cell in which the stored data can be latched without degradation. Typically, a SRAM cell is composed of bistable transistor flip-flops which can be implemented in various configurations. MOS (metal oxide semiconductor) field effect transistors or bipolar transistors are used in the bistable transistor flip-flops. The SRAM cell utilizes more transistors than a typical DRAM (dynamic random memory) cell which has only one transistor and one capacitor for each unit cell. With more transistors employed in forming memory arrays, the packing density of MOSFET devices in the SRAM array is of great consideration. The packing density must be raised greatly to include more memory cells in a single chip.

The buried contact technology, which utilizes doped polycrystalline silicon or titanium nitride (TiN) layers for local interconnect, has been widely applied to the modern integrated circuits, such as SRAM and BiCMOS devices. In U.S. Pat, No. 4,701,423 to N. J. Szluk, a totally self-aligned CMOS process is disclosed. It is disclosed that the buried contacts or self-aligned buried contacts is one of the beneficial structures in improving device performance and device density. However, it is difficult to implement the buried contacts with some other beneficial structures like LDD (lightly doped drain), gate/conductor doping, and self-aligned contacts. The process complexity is increased and the device yield is hard to maintain. A CMOS process which incorporates lightly doped drain-source structures, sidewall oxide structures and self-aligned contacts is disclosed in the invention.

M. H. El-Downy et al. disclose the use of polysilicon layer for local interconnect in a CMOS or BiCMOS technology incorporating sidewall spacers in U.S. Pat. No. 5,082,796. It is addressed that the number of metal layers formed on a given portion of a wafer is limited. Therefore, the use of a polysilicon layer for local interconnect allows the metal layer that was formerly used for local interconnect to be employed as an additional global connection layer. The use of a polysilicon layer to form device contacts also results in the improvement in transistor performance through reduction in device parasitic areas.

The buried contacts provide the electrical interconnection among gate electrodes, drain regions of the cross-coupled MOS transistors and source/drain regions of the transmission-gate transistors. However, the typical buried contacts have a major problem in the formation of the buried contact trench which interrupts the transistor current flow path causing device failure.

In U.S. Pat. No. 5,580,806 to T. T. Chang et al., a method of fabricating a buried contact structure for SRAM is disclosed. The buried contacts are used in a MOS SRAM cell, which employs two loads and two cross-coupled MOS transistors to connect each gate electrode to the drain region of the opposing cross-coupled MOS transistors. The trench formation problem in conventional application of the buried contact technology is also illustrated in the invention. The resistance is increased under the reduction of the impurity dosage.

Y. H. Wu et al disclose a trench free process for SRAM in U.S. Pat. No. 5,705,437. The formation of undoped region or trench is introduced to increase the electrical resistivity or leakage problem. However, the conventional processes in solving the trench formation problem generally incorporate complicate processing steps. The efforts needed in fabrication is thus increased as well as the cost. What is needed is a method to form trench-free buried contacts with simplified process.

SUMMARY OF THE INVENTION

A method for eliminating buried contact trench in MOSFET (metal oxide semiconductor field effect transistor) devices with self-aligned silicide is disclosed in the present invention. A simpler process than conventional buried contact process is provided with improved device performance and characteristics. MOSFET (metal oxide semiconductor field effect transistor) devices having self-aligned silicide are also disclosed and provided with buried contact connection free of buried contact trench.

A MOSFET device with buried contact structure on a semiconductor substrate has following major elements with their relative locations. A gate insulator is on a portion of the substrate and a gate electrode is on the gate insulator. A gate sidewall structure is located on sidewalls of the gate electrode. Inside the substrate, a lightly doped source/drain region is under the gate sidewall structure, and a doped source/drain region abuts the lightly doped source/drain region and is located aside from a region under the gate sidewall structure. In addition, a doped buried contact region is also in the substrate next to the doped source/drain region. On the substrate, a silicon connection is located on a portion of the doped buried contact region, and a shielding block is on the doped buried contact region covering only a region uncovered by the silicon connection. Specifically, the shielding block includes dielectric sidewalls and silicon sidewalls and the shielding block is formed right next to the edge of the silicon connection.

In addition to the aforementioned elements, the MOSFET device can further include metal silicide on the doped source/drain region, the silicon connection, and the gate electrode, in order to provide improved contacts. As to the structure of connections, the MOSFET device further includes a dielectric layer over the silicon connection, the substrate, the gate sidewall structure, and the gate electrode and an interconnection structure in the dielectric layer having electrical contacts with the silicon connection and the gate electrode, preferably through the metal silicide.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method for eliminating buried contact trench in MOSFET (metal oxide semiconductor field effect transistor) devices with self-aligned silicide is disclosed in the present invention. A more simplified process than conventional buried contact process is provided. MOSFET (metal oxide semiconductor field effect transistor) devices having self-aligned silicide are also disclosed and provided with buried contact connection free of buried contact trench. The packing density in forming MOSFET devices can be increased with less efforts in processing steps.

Figure 1:
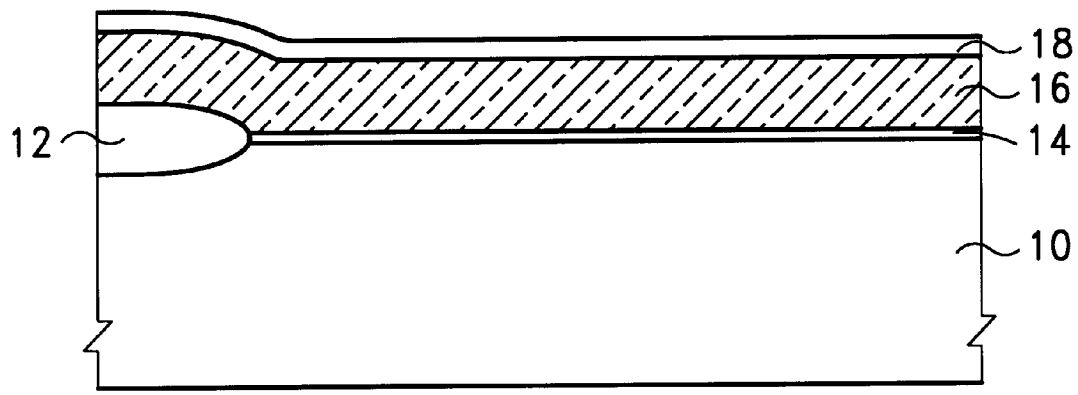
FIG. 1 illustrates a cross-sectional view of forming a gate insulator layer, an undoped silicon layer, and a dielectric layer on a semiconductor substrate in accordance with the present invention.

Referring to FIG. 1, a semiconductor substrate 10 with a preferable single crystalline silicon in a <100> direction is provided. For different applications or specifications, a substrate with different crystalline orientations or materials can be used alternatively. An isolation region using field oxide isolations 12 or other isolation technology like trench isolations (not shown) is formed on the substrate 10. A gate insulator layer 14 is formed over the substrate 10. In the case, a thin oxide layer can be used. The oxide layer 14 can be thermally grown from the substrate 10 with a thickness ranging from about 50 angstroms to 400 angstroms. A wet oxidation or a dry oxidation process can be employed to grow the oxide layer 14.

An undoped silicon layer 16 is than formed over the substrate 10, on both the gate insulator layer 14 and the isolation region 12. The undoped silicon layer 16 can be an undoped poly-crystalline silicon layer which is utilized as a portion of the gate electrode. The undoped poly-crystalline silicon layer 16 can be formed by conventional chemical vapor deposition with silicon containing reactants such as silane or the like. A dielectric layer 18 is then formed on the undoped silicon layer 16. In the preferred embodiments, the dielectric layer can be a silicon oxide layer or a silicon nitride layer, either of which is formed with conventional chemical vapor deposition techniques, with a thickness between about 100 to 1000 angstroms.

Figure 2:
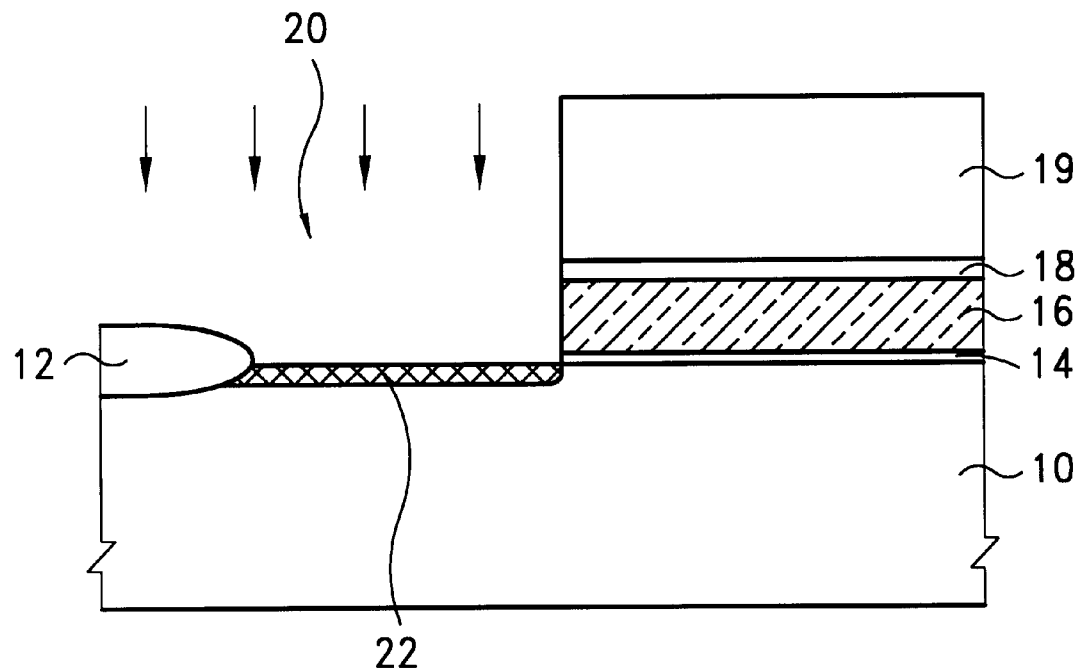
FIG. 2 illustrates a cross-sectional view of defining a buried contact opening and doping the substrate under the buried contact opening for forming a buried contact region in accordance with the present invention.

Referring to FIG. 2, a buried contact opening 20 is defined by removing portions of the dielectric layer 18, of the undoped silicon layer 16, and of the gate insulator layer 14, which are located on the isolation regions 12 and on a portion of the substrate 10. The buried contact opening 20 can be defined by a patterning process which is well known in the art. A photoresist layer 19 can be formed over the dielectric layer 18. The photoresist layer 19 is then defined with a transferred pattern from a photo mask through the typical lithography process. After the photoresist layer 19 is developed, it is used as a mask in etching portions of the dielectric layer 18, of the undoped silicon layer 16, and of the gate insulator layer 14. One or more reactive ion etching (RIE) steps can be performed preferably to etch the three layers to form the buried contact opening 20.

The substrate 10 is then doped for forming a buried contact region 22 under the buried contact opening 20. An ion implantation can be performed using the photoresist layer 18 as a mask. Dopants like phosphorus or arsenic containing dopants can be implanted to form the n-doped buried contact region 22. The dopants can be implanted at an energy between about 10 KeV to 100 KeV to have a dose between about 5E14 to 5E16 atoms/cm$^2$.

Figure 3:
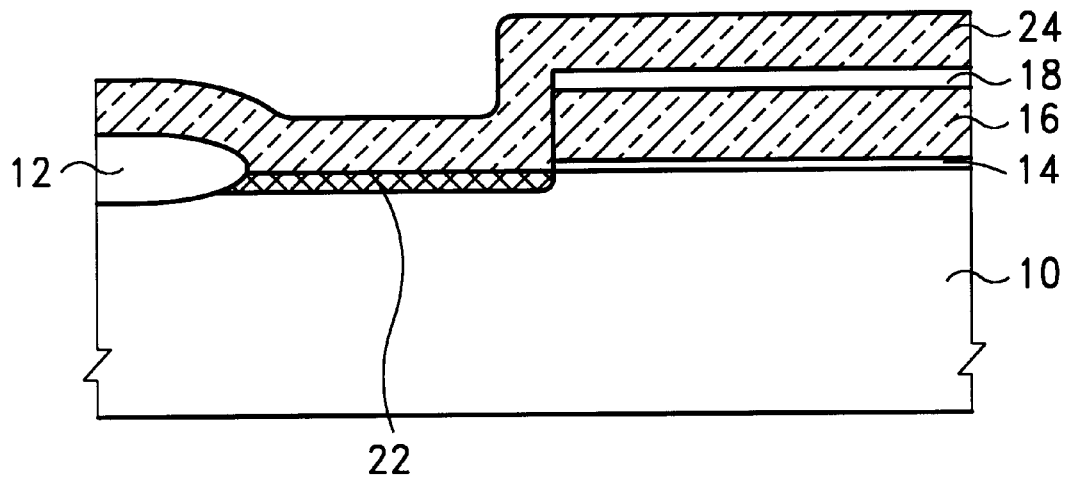
FIG. 3 illustrates a cross-sectional view of forming a doped silicon layer over the substrate in accordance with the present invention.

A doped silicon layer 24 is then formed over the substrate 10, or namely on the isolation region 12, the substrate 10, and the dielectric layer 18, as shown in FIG. 3. In this case, the doped silicon layer 24 is a doped poly-crystalline silicon layer. The doped poly-crystalline silicon layer is also formed by chemical vapor deposition, and the dopants inside the silicon layer 24 can be provided either with an in-situ doped process during deposition or with an ion implantation of dopants. The doped silicon layer is provided for forming a silicon connection to the buried contact region 22.

Figure 4:
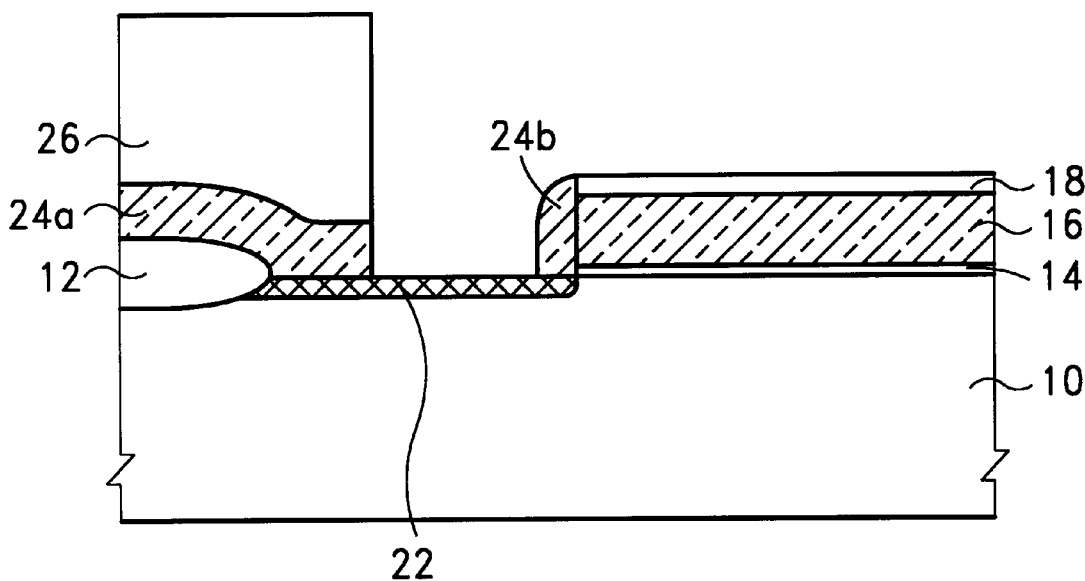
FIG. 4 illustrates a cross-sectional view of removing a portion of the doped silicon layer to leave a silicon connection on the isolation regions and on a portion of the buried contact region, and to leave a doped silicon sidewall in accordance with the present invention.

Turning to FIG. 4, a portion of the doped silicon layer 24 is then removed to leave a silicon connection 24a on the isolation region 12 and on a portion of the buried contact region 22. The removal of a portion of the doped silicon layer 24 can be performed with an etch-back process with a covering mask like a patterned photoresist layer 26 to define the region of forming the silicon connection. A doped silicon sidewall 24b is left on sidewalls of the remaining dielectric layer, of the remaining undoped silicon layer, and of the remaining gate insulator layer after the etch-back process, as indicated in FIG. 4.

Figure 5:
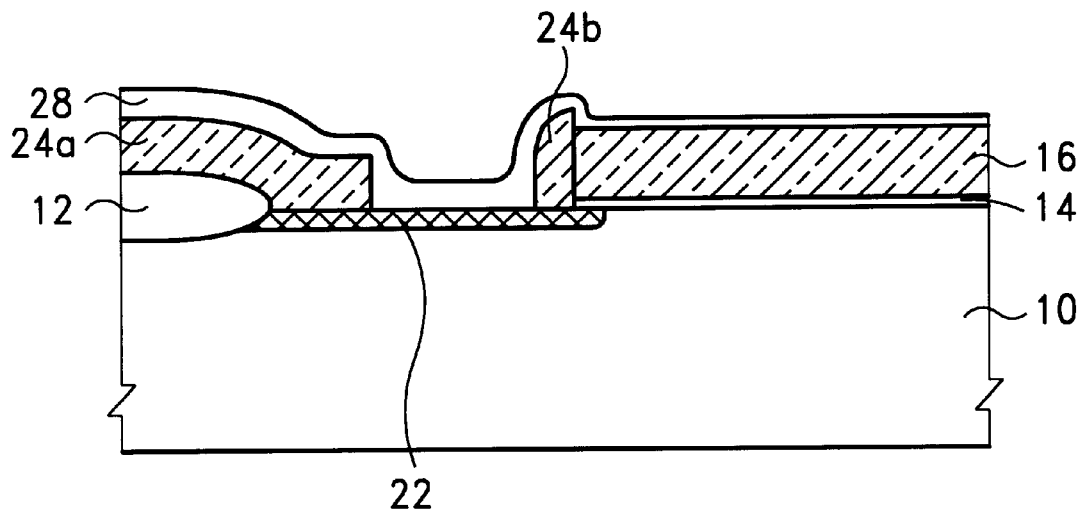
FIG. 5 illustrates a cross-sectional view of removing the dielectric layer and performing a thermal oxidization to form a thermal oxide layer on the doped silicon layer, the substrate, the doped silicon sidewall, and the undoped silicon layer.

Referring to FIG. 5, the dielectric layer 18 is then removed. In such case, an appropriate wet etch can be performed with hot phosphorus acid for silicon nitride or HF containing solution for silicon oxide of the dielectric layer 18. A thermal oxidization process is then performed to form a thermal oxide layer 28 on the silicon connection 24a of the doped silicon layer, the substrate 10, the doped silicon sidewall 24b, and the undoped silicon layer 16. The oxidization can be performed with a thermal process with the presentation of oxygen, steam, or both. Since the oxidization rate of doped silicon materials is much faster than that of undoped silicon materials, the thermal oxide layer 28 on the surface of the undoped silicon layer 16 is much thinner than that on the other regions, as illustrated in FIG. 5.

S. L. Wu (the inventor of the present invention) and his co-workers disclose the dependence of the oxidization rate on the implantation dose in the work: "Characterization of Thin Textured Tunnel Oxide Prepared by Thermal Oxidation of Thin Polysilicon Film on Silicon" (in IEEE Transactions on Electron Devices, vol. 43, p. 287, 1996). The oxidization rate of doped substrate is found to be more than twice faster than the undoped one, as the dose of dopants is raised to about 1E15 to 1E16 atoms/cm$^2$.

Figure 6:
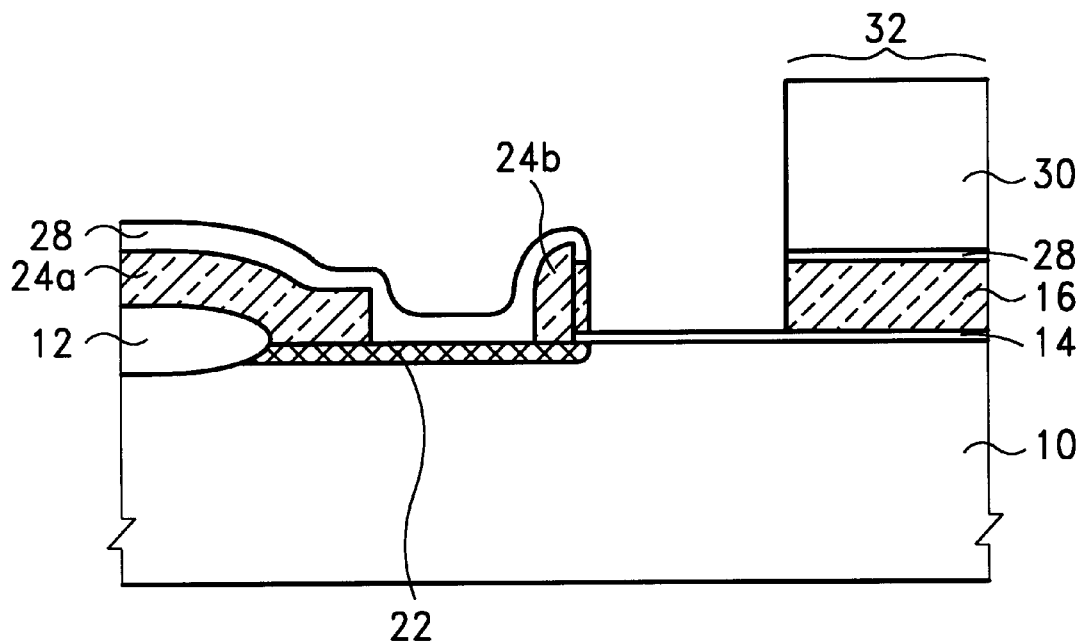
FIG. 6 illustrates a cross-sectional view of defining a gate region by removing portions of the thermal oxide layer and the undoped silicon layer in accordance with the present invention.

Turning to FIG. 6, a gate region 32 is defined by removing portions of the thermal oxide layer 28 and of the undoped silicon layer 16. The gate region 32 can be defined with conventional lithography process to form the patterned photoresist layer 30. An etch step is performed to remove the thin portion of the thermal oxide layer 28 and the uncovered region of the undoped silicon layer 16.

Since the thermal oxide layer 28 on the other regions of the substrate surface is much thicker, the thermal oxide layer 28 is utilized as a mask to prevent the buried contact region 22 from etch damage. Thus the buried contact region 22 can be protected in the etch process and the trench problem in the conventional approach for forming buried contacts can be eliminated. Under the covering of the thermal oxide layer 28, a narrow part of the undoped silicon layer 16 is left to stand beside the doped silicon sidewall 24b after the gate region 32 is defined. The patterned photoresist layer 30 is removed after the etch process.

Figure 7:
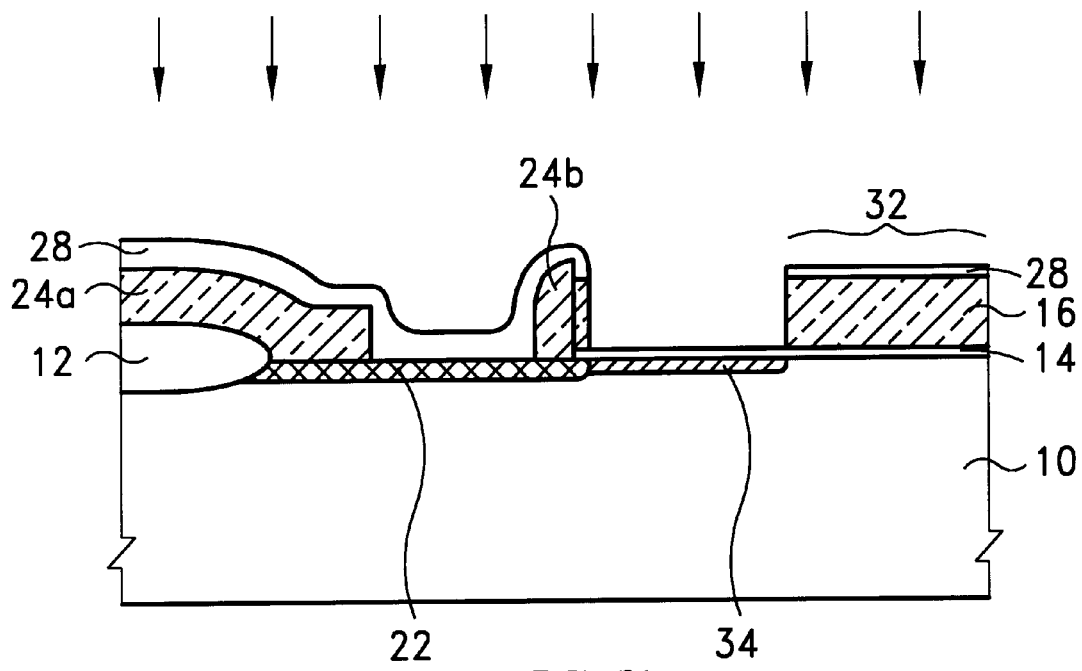
FIG. 7 illustrates a cross-sectional view of doping the substrate for forming a lightly doped source/drain region in accordance with the present invention.

Following the formation of the gate region 32, the substrate is doped for forming a lightly doped source/drain region 34 in the substrate 10 under a region between the doped silicon sidewall 24b and the gate region 32, as shown in FIG. 7. An ion implantation can be performed with dopants like phosphorus or arsenic containing dopants. The dopants can be implanted at an energy between about 10 KeV to 80 KeV to have a dose between about 5E12 to 5E14 atoms/cm$^2$ in the lightly doped source/drain region 34.

Figure 8:
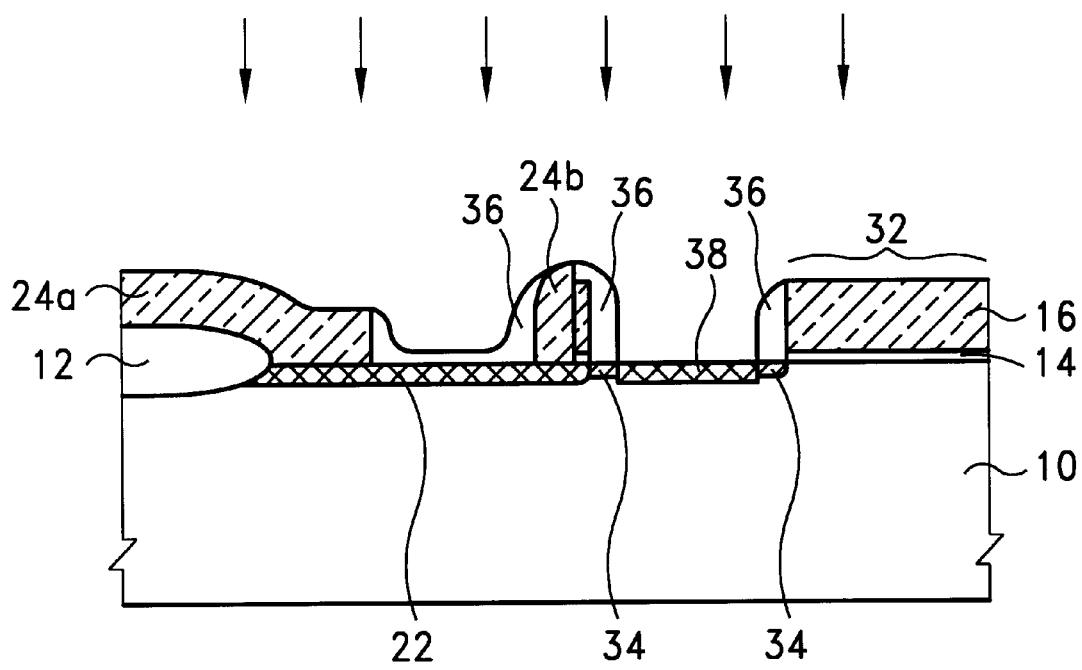
FIG. 8 illustrates a cross-sectional view of forming dielectric sidewalls on sidewalls of the gate region and of the doped silicon sidewall and doping the substrate for forming a source/drain region in accordance with the present invention.

Turning to FIG. 8, dielectric sidewalls 36 are then formed on the sidewalls of the gate region 32 and on the sidewalls of the doped silicon sidewall 24b. The dielectric sidewalls 36 can be formed by depositing and etching-back a dielectric layer of silicon oxide, in order to form silicon oxide spacers. In such case, the spacer in the dielectric sidewalls 36 formed on the left side of the doped silicon sidewall 24b is left to fill tip the space between the doped silicon sidewall 24b and the silicon connection 24a, as shown in FIG. 8.

Another doping step is performed to dope the substrate 10 for forming a source/drain region 38 in the substrate 10 under an exposed region of the substrate 10. An ion implantation can be performed using the dielectric sidewalls 36 as a mask. Dopants like phosphorus or arsenic containing dopants can be implanted to form the source/drain region 38. The dopants can be implanted at an energy between about 10 KeV to 100 KeV to have a dose between about 5E14 to 5E16 atoms/cm$^2$. The undoped silicon layer 16 which serves the gate electrode can also be doped with the implanted dopants. The implanted dopants can further be diffused and activated by the thermal process performed in later steps. Therefore, a buried contact structure with silicon connection 24a is provided without trench defects with the aforementioned processes.

Figure 9:
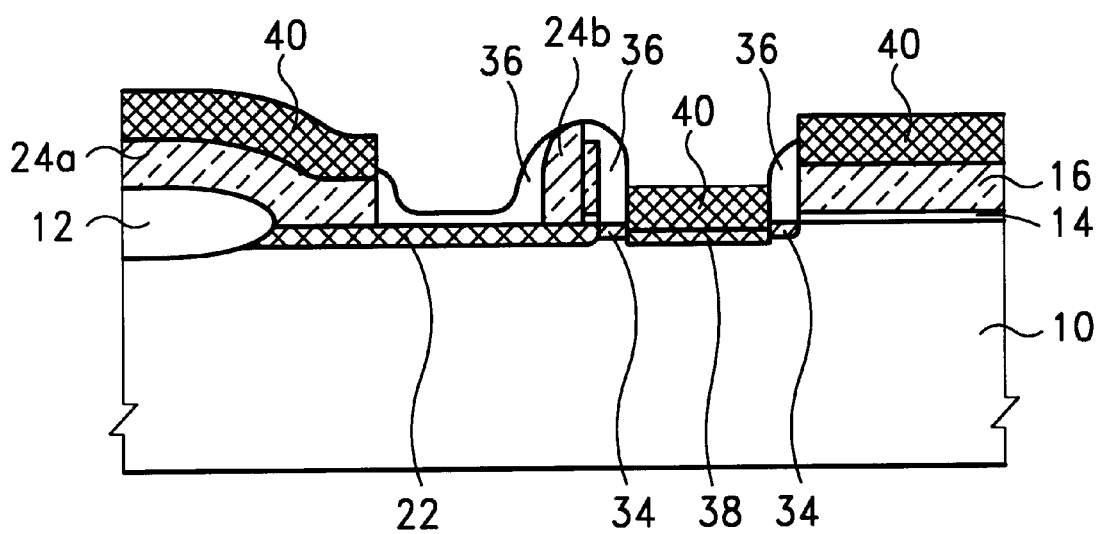
FIG. 9 illustrates a cross-sectional view of forming a metal silicide layer on the silicon connection, the exposed region of the substrate, and the gate region in accordance with the present invention.

In addition to the illustrated steps, a series of additional steps can be optionally carried out to improve the characteristics of the devices. Referring to FIG. 9, a metal silicide layer 40 is respectively formed on the silicon connection 24a of the dope silicon layer, the exposed region of the substrate 10 in the source/drain region 38, and the gate region 32.

The metal silicide layer 40 is typically formed by depositing a noble or refractory metal layer, such as Ti, W, Co, Pt, Ni, Cr, and etc. A two-step thermal process or RTP (rapid thermal process) is then carried out. The first rapid thermal process for annealing is performed to form metal silicide 40 on the silicon connection 24a, the source/drain region 38, and the gate region 32. In this preferred embodiment, a first step RTP process is performed to form metal silicide 40 at the temperature about 300 to 700° C. for 30 to 180 seconds, by which the dopants in the junction regions 34 and 38 and buried contact region 22 are diffused and activated.

The remaining non-reacted metal layer is removed to leave the metal silicide 40. Next, a second RTP process is performed to transform the metal silicide 40 into a stabilized phase for providing improved electrical characteristics. In this preferred embodiment, the second rapid thermal process for annealing is performed at the temperature about 700 to 1150° C. for 10 to 100 seconds, by which the dopants in the doped regions can be activated.

Figure 10:
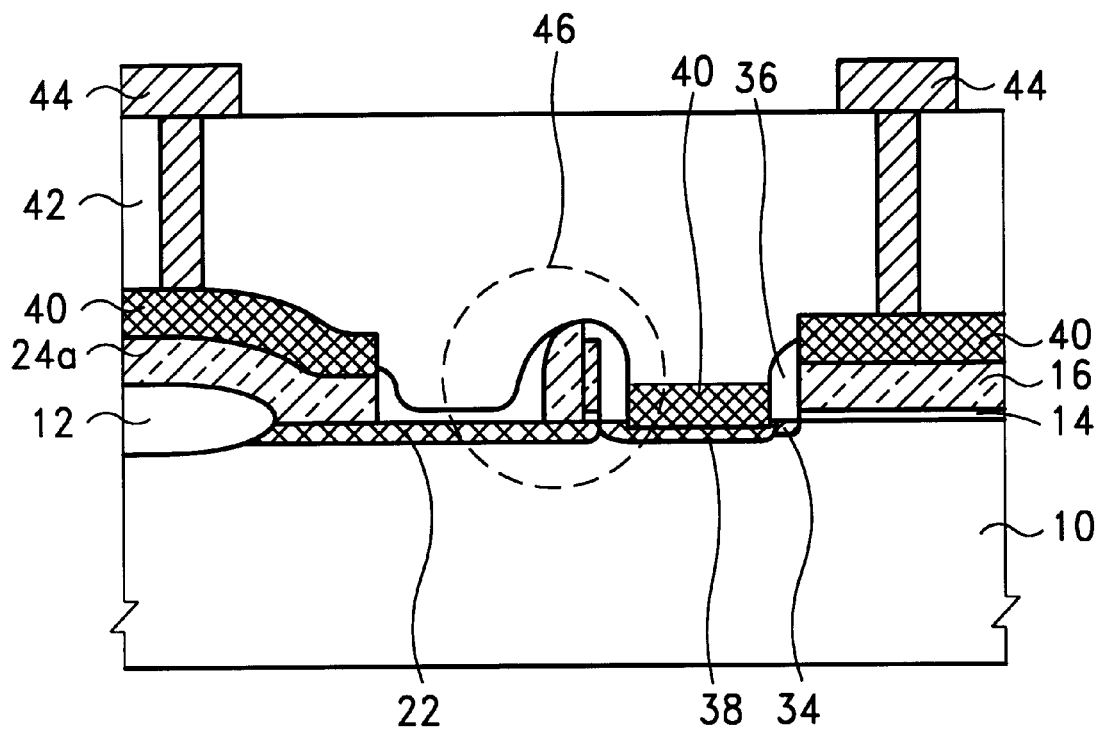
FIG. 10 illustrates a cross-sectional view of forming an inter-layer dielectric layer on the substrate and performing a metallization process for forming interconnections in the dielectric layer and on the dielectric layer in accordance with the present invention.

Finally, for making connections, an inter-layer dielectric (ILD) layer 42 is formed on the substrate 10, as shown in FIG. 10. A metallization process is performed for forming interconnections 44 in the dielectric layer 42 and on the dielectric layer 42 to respectively connect to the doped silicon layer 24 and the gate region 32, preferably through the improved contact of the metal silicide 40.

Referring to FIG. 10, the fabricated MOSFET device with buried contact structure on a semiconductor substrate has the following major elements with their relative locations. A gate insulator 14 is on a portion of the substrate 10 and a gate electrode 16 is on the gate insulator 14. A gate sidewall structure 36 is located on sidewalls of the gate electrode 16. Inside the substrate, a lightly doped source/drain region 34 is under the gate sidewall structure 36, and a doped source/drain region 38 is abutting the lightly doped source/drain region 34 and located aside from a region under the gate sidewall structure 36. In addition, a doped buried contact region 22 is also in the substrate next to the doped source/drain region 38. On the substrate 10, a silicon connection 24a is located on a portion of the doped buried contact region 22, and a shielding block 46 is on the doped buried contact region 22 covering only a region uncovered by the silicon connection 24a. Specifically, the shielding block 46 includes dielectric sidewalls 36 and silicon sidewalls 24b and the shielding block 46 is formed right next to the edge of the silicon connection 24a.

In addition to the aforementioned elements, the MOSFET device can further include metal silicide 40 on the doped source/drain region 38, the silicon connection 24a, and the gate electrode 16, in order to provide improved contacts. As to the structure of connections, the MOSFET device further includes a dielectric layer 42 over the silicon connection 24a, the substrate 10, the gate sidewall structure 36, and the gate electrode 16 and an interconnection structure 44 in the dielectric layer 42 having electrical contacts with the silicon connection 24a and the gate electrode 16, preferably through the metal silicide 40.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A transistor having transistor on a semiconductor substrate, said transistor comprising:
    a gate insulator over a portion of said substrate;
    a gate electrode over said gate insulator;
    a gate sidewall structure on sidewalls of said gate electrode;
    a lightly doped source/drain region in said substrate under said gate sidewall structure;
    a doped source/drain region in said substrate abutting said lightly doped source/drain region, said doped source/drain region located aside from a region under said gate insulator;
    a doped buried contact region in said substrate next to said doped source/drain region;
    a silicon connection on a portion of said doped buried contact region; and
    a shielding block on said doped buried contact region covering only a region uncovered by said silicon connection, said shielding block comprising dielectric sidewalls and silicon sidewalls, said shielding block being formed next to an edge of said silicon connection.

2. The transistor of claim 1, wherein said shielding block is made by surrounding said silicon sidewalls with said dielectric sidewalls.

3. The transistor of claim 1, wherein said dielectric sidewalls comprises oxide spacers.

4. The transistor of claim 1 further comprises metal silicide on said doped source/drain region, said silicon connection, and said gate electrode.

5. The transistor of claim 1 further comprises:
    a dielectric layer over said silicon connection, said substrate, said gate sidewall structure, and said gate electrode; and
    an interconnection structure in said dielectric layer having electrical contacts with said silicon connection and said gate electrode.

6. The transistor of claim 1, wherein said gate insulator comprises a gate oxide layer.

7. The transistor of claim 1, wherein said gate electrode comprises a polysilicon layer.

8. The transistor of claim 1, wherein said gate sidewall structure comprises oxide spacers.

9. The transistor of claim 1, wherein said lightly doped source/drain region contains phosphorus or arsenic containing dopants at a dose between about 5E12 to 5E14 atoms/cm$^2$.

10. The transistor of claim 1, wherein said source/drain region contains phosphorus or arsenic containing dopants at a dose between about 5E14 to 5E16 atoms/cm$^2$.

11. The transistor of claim 1, wherein said buried contact region contains phosphorus or arsenic containing dopants at a dose between about 5E14 to 5E16 atoms/cm$^2$.

12. The transistor of claim 1, wherein said silicon connection comprises a doped polysilicon layer.

13. A transistor on a semiconductor substrate, said transistor comprising:
    a gate insulator over a portion of said substrate;
    a gate electrode over said gate insulator;
    a gate sidewall structure on sidewalls of said gate electrode;
    a lightly doped source/drain region in said substrate under said gate sidewall structure;
    a doped source/drain region in said substrate abutting said lightly doped source/drain region, said doped source/drain region located aside from a region under said gate insulator;
    a doped buried contact region in said substrate next to said doped source/drain region;
    a silicon connection on a portion of said doped buried contact region;
    a shielding block on said doped buried contact region covering only a region uncovered by said silicon connection, said shielding block comprising dielectric sidewalls and silicon sidewalls, said silicon sidewalls being surrounded by said dielectric sidewalls, said shielding block being formed next to an edge of said silicon connection;
    metal silicide on said doped source/drain region, said silicon connection, and said gate electrode;
    a dielectric layer over said silicon connection, said substrate, said gate sidewall structure, and said gate electrode; and
    an interconnection structure in said dielectric layer having electrical contacts with said silicon connection and said gate electrode.

14. The transistor of claim 13, wherein said dielectric sidewalls comprises oxide spacers.

15. The transistor of claim 13, wherein said gate insulator comprises a gate oxide layer.

16. The transistor of claim 13, wherein said gate electrode comprises a polysilicon layer.

17. The transistor of claim 13, wherein said gate sidewall structure comprises oxide spacers.

18. The transistor of claim 13, wherein said lightly doped source/drain region contains phosphorus or arsenic containing dopants at a dose between about 5E12 to 5E14 atoms/cm$^2$.

19. The transistor of claim 13, wherein said source/drain region contains phosphorus or arsenic containing dopants at a dose between about 5E14 to 5E16 atoms/cm$^2$.

20. The transistor of claim 13, wherein said buried contact region contains phosphorus or arsenic containing dopants at a dose between about 5E14 to 5E16 atoms/cm$^2$.

* * * * *